United States Patent
Chuai et al.

(10) Patent No.: US 10,476,516 B1
(45) Date of Patent: Nov. 12, 2019

(54) PRE-DRIVER PEAKING TECHNIQUE FOR HIGH-SPEED DACS

(71) Applicant: Avago Technologies International Sales Pte. Limited, Singapore (SG)

(72) Inventors: Kun Chuai, Irvine, CA (US); Afshin Momtaz, Irvine, CA (US); Jun Cao, Irvine, CA (US); Seong-Ho Lee, Irvine, CA (US); Burak Catli, Irvine, CA (US); Anand J. Vasani, Irvine, CA (US); Ali Nazemi, Irvine, CA (US)

(73) Assignee: AVAGO TECHNOLOGIES INTERNATIONAL SALES PTE LIMITED, Singapore (SG)

( * ) Notice: Subject to any disclaimer, the term of this patent is extended or adjusted under 35 U.S.C. 154(b) by 0 days.

(21) Appl. No.: 16/163,446

(22) Filed: Oct. 17, 2018

(51) Int. Cl.
*H03M 1/66* (2006.01)
*H04B 1/40* (2015.01)
*H01L 23/498* (2006.01)

(52) U.S. Cl.
CPC ....... *H03M 1/662* (2013.01); *H01L 23/49816* (2013.01); *H04B 1/40* (2013.01)

(58) Field of Classification Search
CPC .......................... H03M 1/662; H03K 19/0175
USPC .............................. 341/144; 326/82; 327/333
See application file for complete search history.

(56) References Cited

U.S. PATENT DOCUMENTS

| | | | | |
|---|---|---|---|---|
| 5,606,320 A * | 2/1997 | Kleks | ................... | H03M 1/002 341/118 |
| 6,566,933 B1* | 5/2003 | Lye | ........................ | H04L 25/028 327/337 |
| 7,511,549 B1* | 3/2009 | Luo | .................. | H03K 3/356139 327/307 |
| 8,274,307 B1* | 9/2012 | Ben Artsi | .............. | H01P 3/026 326/30 |
| 9,325,316 B1* | 4/2016 | Abou-El-Sonoun | ........................ | H03K 19/018514 |
| 10,187,080 B1* | 1/2019 | Thasari | .................... | H03M 1/74 |
| 2006/0176087 A1* | 8/2006 | Gupta | .................. | H03K 17/162 327/108 |
| 2008/0278208 A1* | 11/2008 | Jung | ........................ | H03K 5/12 327/170 |
| 2011/0285568 A1* | 11/2011 | Harpe | ..................... | H03M 1/56 341/158 |
| 2013/0335117 A1* | 12/2013 | Li | .................. | H03K 19/017509 326/82 |
| 2015/0194958 A1* | 7/2015 | Liu | .......................... | G05F 3/02 327/108 |

FOREIGN PATENT DOCUMENTS

JP             201720074      * 11/2017

* cited by examiner

*Primary Examiner* — Lam T Mai
(74) *Attorney, Agent, or Firm* — Morgan, Lewis & Bockius LLP (57) ABSTRACT

A pre-driver circuit includes a differential input circuit to receive a differential-input voltage. A latch circuit can latch voltage levels of output-voltage signals at a differential output port of the pre-driver circuit. A pair of capacitors couple the differential input circuit to the latch circuit. The pre-driver circuit can enable peaking of the output-voltage signals for high-speed operation of the pre-driver circuit and a digital-to-analog converter (DAC)-driver circuit coupled to the pre-driver circuit.

20 Claims, 6 Drawing Sheets

PRE-DRIVER PEAKING TECHNIQUE FOR HIGH-SPEED DACS

TECHNICAL FIELD

The present description relates generally to integrated circuits and, more particularly, to a pre-driver peaking technique for high-speed digital-to-analog converters (DACs).

BACKGROUND

High-speed digital-to-analog converters (DACs) are used in a number of communication systems, in particular in wired communication systems such as Ethernet network and optical communication systems and devices. For systems using very high-speed DAC drivers, with speeds exceeding 110 Gbps, the overall system performance can be severely impacted by not only package, board and electrostatic discharge (ESD) circuitry, but also the limited bandwidth of pre-driver and driver circuits. The overall system performance degradation may include inter-symbol interference (ISI) increase, signal-to-noise ratio (SNR) degradation and effective number of bits (ENOB) reduction. Bandwidth enhancement of the pre-driver and driver can significantly improve the overall system performance.

The use of inductive peaking techniques such as shunt peaking and T-coil techniques at the DAC driver output can improve system performance impaired by package, board and ESD. These techniques, however, suffer from a number of disadvantages including large on-chip area, limited programmability to adapt to different package and board and lack of ability to overcome the bandwidth limitation of the driver and pre-driver circuits. Another approach is to use a digital pre-emphasis technique to improve system performance. The digital pre-emphasis technique has its own disadvantages, for example, reduction of DAC output amplitude, restricted voltage resolution limited by the DAC resolution and high digital power consumption for tap computations.

BRIEF DESCRIPTION OF THE DRAWINGS

Certain features of the subject technology are set forth in the appended claims. However, for purposes of explanation, several embodiments of the subject technology are set forth in the following figures.

DETAILED DESCRIPTION

The detailed description set forth below is intended as a description of various configurations of the subject technology and is not intended to represent the only configurations in which the subject technology may be practiced. The appended drawings are incorporated herein and constitute part of the detailed description. The detailed description includes specific details for the purpose of providing a thorough understanding of the subject technology. However, the subject technology is not limited to the specific details set forth herein and may be practiced without one or more of the specific details. In some instances, structures and components are shown in a block diagram form in order to avoid obscuring the concepts of the subject technology.

The subject technology is directed to circuits and techniques to achieve pre-driver peaking for high-speed digital-to-analog converters (DACs). For systems using DACs with speeds exceeding about 100 Gbps, the conventional pre-drivers cannot provide sufficient bandwidth to avoid impacting the overall system performance parameters such as inter-symbol interference (ISI), signal-to-noise ratio (SNR) and effective number of bits (ENOB). The pre-driver of the subject technology includes a number of circuit-level, system-level and product-level advantages. The circuit-level advantages include, but are not limited to, DAC driver performance improvements, adaptability of traditional back-end circuits, reduction in power consumption due to the use of a capacitance-divider that reduces pre-driver loading and the fact that the majority of currents are drawn from the low-voltage domain. Among the system-level advantages, reduction of system ISI, programmability to adapt to different channels and the use of a software loop to seek optimal settings are more prominent. The product-level advantages include, but are not limited to, applicability to many DAC drivers, low-power consumption and scalability to a wide frequency range covering various standards.

Figure 1A:
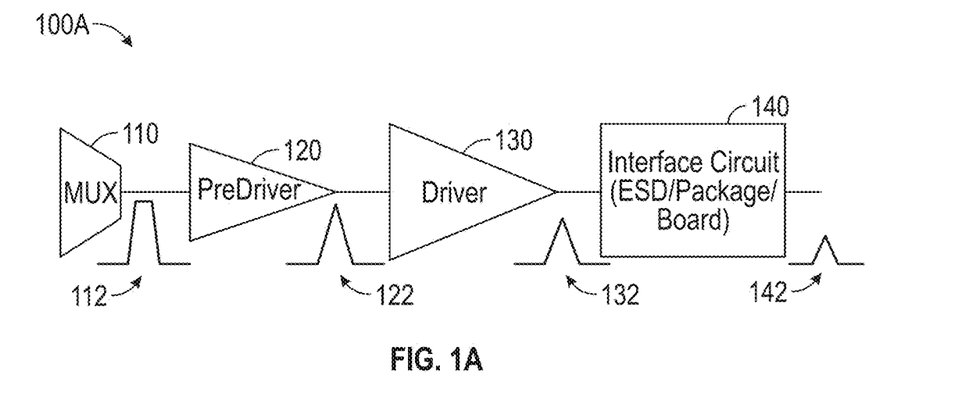
FIGS. 1A-1B are diagrams illustrating an example of a DAC transmitter circuit including a DAC pre-driver and corresponding waveforms, in accordance with one or more aspects of the subject technology.
Figure 1B:
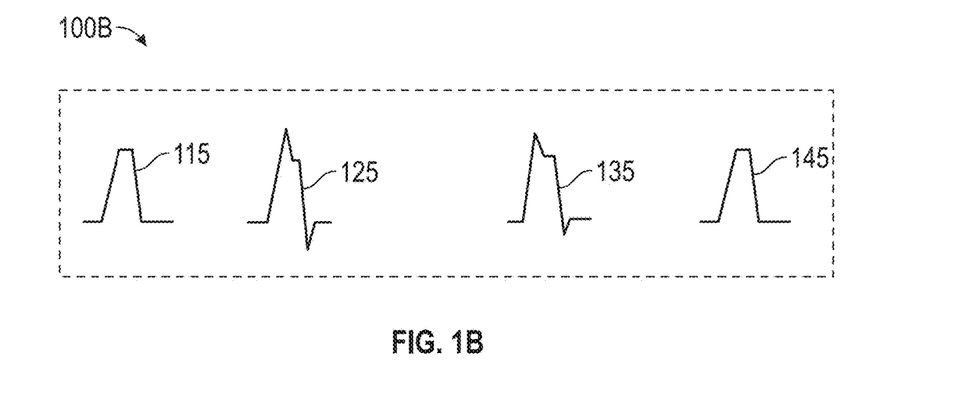

FIGS. 1A-1B are diagrams illustrating an example of a DAC transmitter circuit 100A including a DAC pre-driver 120 and corresponding waveforms, in accordance with one or more aspects of the subject technology. The DAC transmitter circuit 100A includes a multiplexer (MUX) 110, the DAC pre-driver 120 (hereinafter "pre-driver 120"), a driver 130 and an interface circuit 140 representing electrostatic discharge (ESD) circuits, packaging and board traces and components. The MUX 110 receives parallel digital input data and converts the received digital input data into an input signal (e.g., a differential input signal) for the pre-driver 120. The driver 130 is the DAC driver circuit that sends out the final DAC signal to the channel. The interface circuit 140 can include a circuit model, for example, an equivalent S-parameter model that represent the ESD circuits and packaging and board traces and components (e.g., vias) that couple the driver 130 to the DAC circuit.

The pre-driver 120 can be a peaking pre-driver that is the heart of the subject technology and is discussed in more detail herein. Without a peaking pre-driver, the signals at the output ports of the MUX 110, the pre-driver 120, the driver 130 and the interface circuit 140 can have waveforms 112, 122, 132 and 142 shown in FIG. 1A. The waveform 112 is a pulse that depicts a single bit (e.g., a logic 1) of the input signal and deviates from an ideal square pulse due to non-ideal frequency response of the MUX 110. The limited bandwidth of the pre-driver 120 (e.g., non-peaking pre-drivers, such as existing pre-drivers) distorts the input pulse and generate an output pulse having the waveforms 122. The waveform 112 of the input signal experiences further distortions and attenuation as it passes through the driver 130 and the interface circuit 140.

The pre-driver circuit of the subject technology discussed herein can substantially improve the waveforms as it enjoys a significantly higher bandwidth due to peaking, as shown in the set of waveforms 100B of FIG. 1B. The set of waveforms 100B include waveforms 115, 125, 135 and 145. The waveform 115 is similar to the waveform 112, but the waveform 125 of a peaking pre-driver of the subject technology includes a surge created by the peaking pre-driver and can pass through the driver 130, without a noticeable change (see waveform 135). The surge in the waveform 135 is removed by the interface circuit 140 and an output signal with the waveform 145, which is substantially similar to the waveform 115 almost without a significant change, is produced.

Figure 2A:
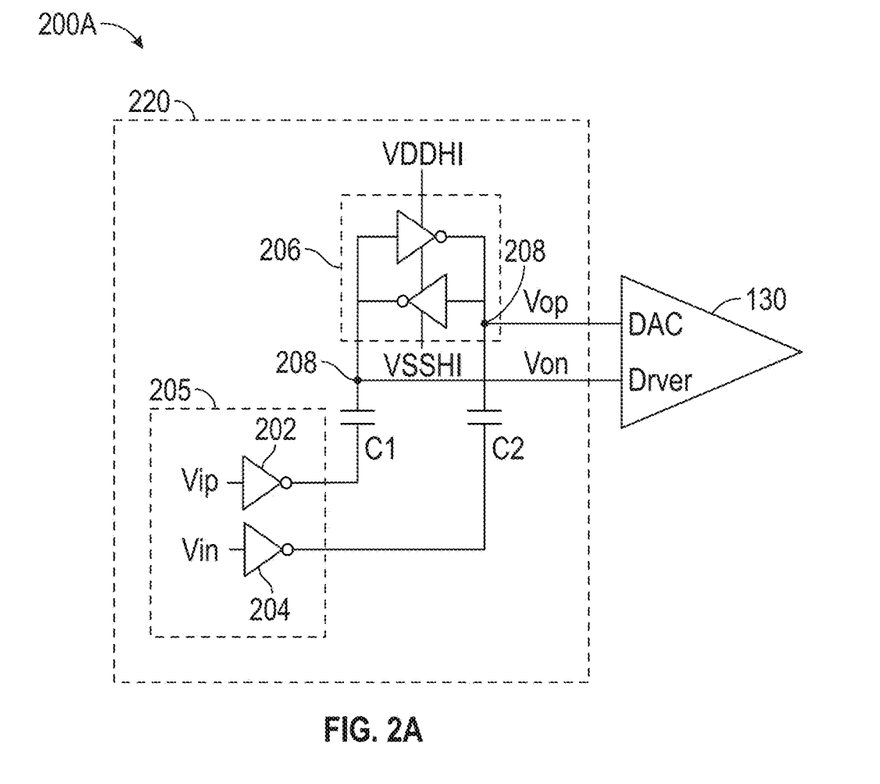
FIGS. 2A through 2C are schematic diagrams illustrating an example of a DAC pre-driver circuit and corresponding AC and DC equivalent circuits, in accordance with one or more aspects of the subject technology.
Figure 2B:
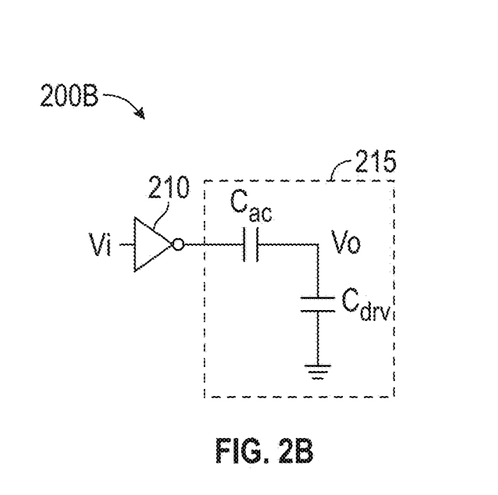
Figure 2C:
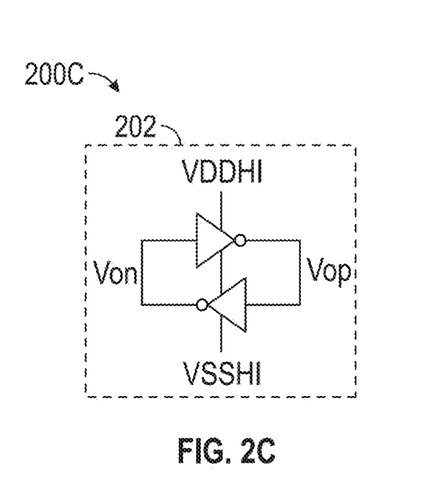

FIGS. 2A through 2C are schematic diagrams illustrating an example of a DAC pre-driver circuit 220 and corresponding high-frequency (AC) and low-frequency (DC) equivalent circuits 200B and 200C, in accordance with one or more aspects of the subject technology. The DAC pre-driver circuit 220 (hereinafter "pre-driver circuit 220") of the subject technology is coupled to the driver 130 (e.g., a DAC driver) as shown in a schematic diagram 200A of FIG. 2. The pre-driver circuit 220 includes a differential input circuit 205 and a latch circuit 206 that is coupled to the differential input circuit 205 via a pair of capacitors C1 and C2. The differential input circuit 205 includes inverters 202 and 204 that receive a differential input signal including input signals yin and vip. The output nodes of the inverters 202 and 204 are connected to first nodes of the capacitors C1 and C2. The second nodes of the capacitors C1 and C2 are connected to the nodes of an output port 208 of the pre-driver circuit 220. The capacitance values of the capacitors C1 and C2 depends on the desired amount of surge in the output signal of the pre-driver circuit 220 and loading by the driver 130.

The latch circuit 206 includes a pair of cross-coupled inverters and is connected between the nodes of the output port 208 of the pre-driver circuit 220. The latch circuit 206 can store states of the voltage levels of the output voltage signals von and vop at the output port 208 at low frequencies (e.g., near zero frequency). The capacitors C1 and C1 have a role in determining high-frequency behavior of the pre-driver circuit 220, whereas the latch circuit 206 is important in determining low-frequency characteristics of the pre-driver circuit 220, as discussed herein.

The high-frequency equivalent circuit 200B shown in FIG. 2B includes a capacitor voltage divider 215 (hereinafter "voltage-divider 215") formed of capacitors $C_{ac}$ and $C_{drv}$, which are connected in series between an output of an inverter 210 and the ground potential. The inverter 210 represents one of the inverters 202 or 204 of FIG. 2A, and the capacitor $C_{ac}$ represents a respective one of the capacitors C1 or C2 of FIG. 2A. The capacitor $C_{drv}$ is an input capacitance of the DAC driver 130 seen from one of its input nodes. In other words, the high-frequency equivalent circuit 200B signifies a high-frequency path between an input signal vi that represents one of the input signals yin and vip and the ground potential. The high-frequency response of the pre-driver circuit 220 is defined by the relation between an amplitude ($A_{vo}$) of the output voltage siganl vo, representing one of von or vop of FIG. 2A, and an amplitude ($A_{vi}$) of the input voltage vi and can be expressed as:

$$A_{vo}/A_{vi} = C_{ac}/(C_{ac}+C_{drv}) \quad \text{(Eq. 1)}$$

The expression of Eq. 1 indicates that at high frequencies, a voltage swing of the output-voltage signals (e.g., von and vop) is determined by capacitance values of capacitors of the voltage-divider 215. The high-frequencies refer to frequencies above the high cut-off frequency of the frequency response of the pre-driver circuit.

The low-frequency (DC) equivalent circuit 200C shown in FIG. 2C includes the latch circuit 206, with respective high and low bias voltages VDDHI and VSSHI. In some implementations, values of the high and low bias voltages VDDHI and VSSHI can be about 1.2 V and 0.6 V, respectively. It is understood that at low frequencies, the capacitors C1 and C2 are almost open circuit (with a substantially high impedance), which isolates the output port 208 from the differential input circuit 205. In this case, only the latch circuit 206 would remain connected between nodes of the output port 208. The latch circuit 206 stores voltage levels of the output voltage signals von and vop, which are either at VDDHI or at VSSHI. In some implementations, the high and low bias voltages VDDHI and VSSHI can be generated by low-drop-out (LDO) circuits and voltage values of the high and low bias voltages VDDHI and VSSHI can be programmable and be controlled by, hardware (e.g., a processor), firmware or software.

Figure 3A:
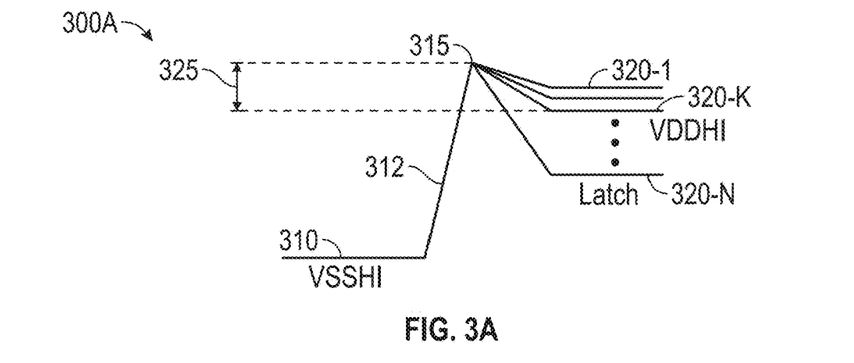
FIGS. 3A-3B are diagrams illustrating example output signal waveforms of the DAC pre-driver circuit of FIG. 2A, in accordance with one or more aspects of the subject technology.

FIGS. 3A-3B are diagrams illustrating example output signal waveforms 300A and 300B of the DAC pre-driver circuit of FIG. 2A, in accordance with one or more aspects of the subject technology. The waveforms 300A shown in FIG. 3A represent an output voltage signal at the output port 208 of FIG. 2A (e.g., von or vop) with a surge (peaking), as described herein. For example, the waveforms 300A can be considered to be the output voltage signal von. The the waveforms 300A of the output voltage signal von starts at a DC level 310 that is equal to the low bias voltage VSSHI. With the rise of the input signal yin of FIG. 2A (depicted by waveform 115 of FIG. 1B) the output voltage level of the output voltage signal von also rises with a slope 312 and reaches a peak 315 and slowly drops to the voltage level 320 (e.g., one of 320-1 . . . 320-N). The voltage level 320 equals the value of the high bias voltage level VDDHI, which is the new stored value in the latch circuit 206 of FIG. 2A for the voltage level of the output voltage signal von. As the high bias voltage level VDDHI is programmable, the voltage level 320 can take different values such as shown by 320-k, where k can take integer values between 1 and N (e.g., 64). The surge amplitude or peaking amplitude is shown as the difference 325 between voltage levels at the peak 315 and at a respective voltage level 320-k. The voltage level at the peak 315 is defined by the voltage-divider 215 of FIG. 2B. Based on the expression in Eq. 1, the voltage level at the peak 315 is larger than the voltage peak value of the input voltage signal vi (e.g., of 115 of FIG. 1B).

Figure 3B:
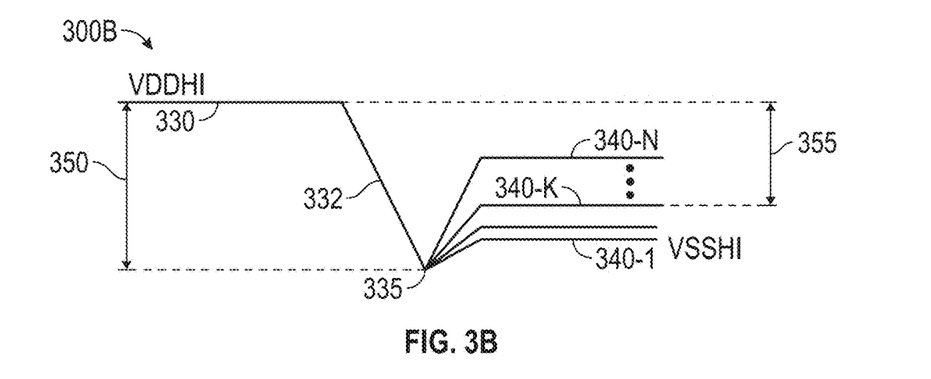

The waveforms 300B shown in FIG. 3B represent the output voltage signal at the output port 208 of FIG. 2A, for example, the output voltage signal vop. The waveforms 300B of the output voltage signal vop can start at the voltage level 330 that is equal to the high bias voltage level VDDHI (this is at the same time that von is at the low bias voltage VSSHI). With the change of the input voltage signal vi, the output voltage signal vop transitions via the slope 332 to the voltage peak value 335 and then transitions to the voltage level 340 (e.g., 340-1 . . . 340-N) that is equal to the low bias voltage VSSHI. The voltage level 340 can have different values, for example, 340-k which is programmable, as the low bias voltage VSSHI can be programmable (e.g., via hardware, firmware or software). FIG. 3B also shows an AC amplitude 350 and a DC amplitude 355. A peaking factor can be defined for the pre-driver circuit 220 of FIG. 2A as follows:

$$\text{Peaking factor} = AC \text{ amplitude}/DC \text{ amplitude} \qquad \text{(Eq. 2)}$$

Therefore, peaking can be achieved by having AC amplitude higher than the DC amplitude. The peaking can be programmable as the DC amplitude 355 is dependent on the voltage level 340-$k$ that is in turn defined by the low bias voltage VSSHI, which is programmable. It is understood that the resolution by which the voltage level 340-$k$ can be changed defines the peaking resolution.

Figure 4:
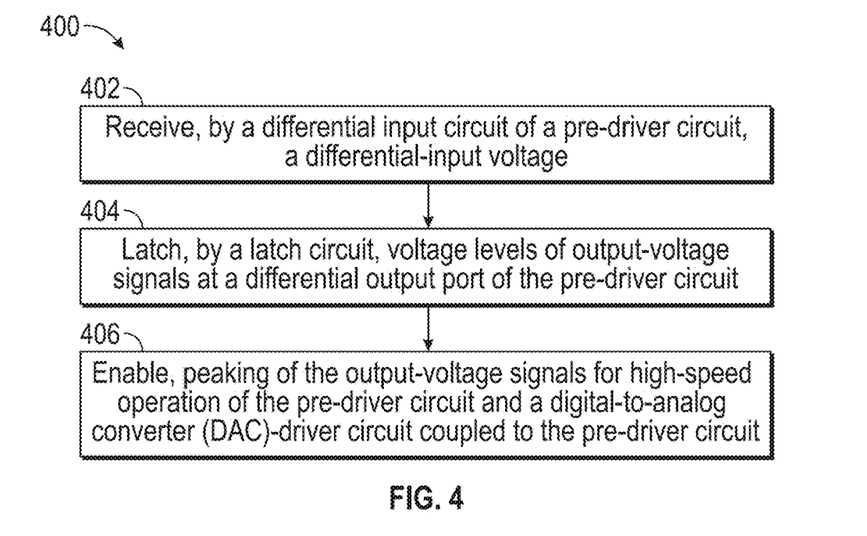
FIG. 4 is a flow diagram illustrating an example of a pre-driver peaking method for high-speed DACs, in accordance with one or more aspects of the subject technology.

FIG. 4 is a flow diagram illustrating an example of a pre-driver peaking method 400 for high-speed DACs, in accordance with one or more aspects of the subject technology. The method 400 includes receiving, by a differential input circuit (e.g., 205 of FIG. 2A) of a pre-driver circuit (e.g., 220 of FIG. 2A), a differential-input voltage (e.g., vip and yin of FIG. 2A) (402). The method further includes latching, by a latch circuit (e.g., 206 of FIG. 2A), voltage levels of output-voltage signals (e.g., von and vop of FIG. 2A) at a differential output port (e.g., 208 of FIG. 2A) of the pre-driver circuit (404). Peaking of the output-voltage signals is enabled for high-speed (e.g., >100 Gbps) operation of the pre-driver circuit and a digital-to-analog converter (DAC)-driver circuit (e.g., 130 of FIG. 2A) coupled to the pre-driver circuit (406). The differential input circuit is coupled to the latch circuit via a pair of capacitors (e.g., C1 and C2 of FIG. 2A).

Figure 5A:
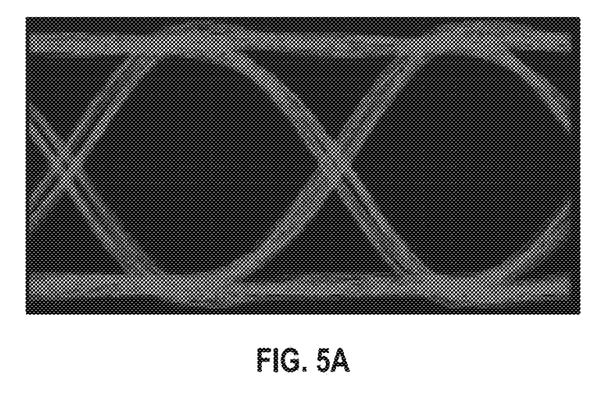
FIGS. 5A through 5E are diagrams illustrating simulation results of an example DAC pre-driver circuit, in accordance with one or more aspects of the subject technology.
Figure 5B:
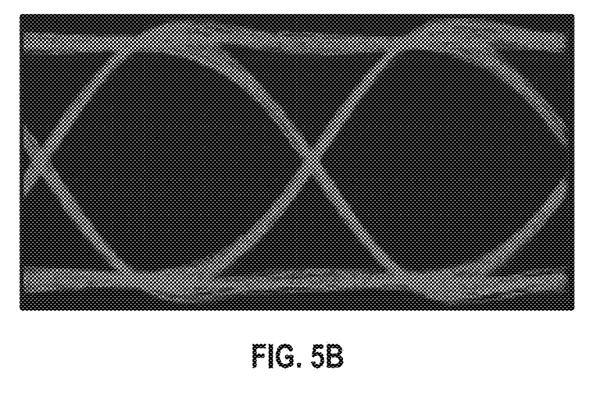

FIGS. 5A through 5E are diagrams illustrating simulation results of an example DAC pre-driver circuit (e.g., 220 of FIG. 2), in accordance with one or more aspects of the subject technology. The simulations results shown in FIGS. 5A and 5B are non-return-to-zero (NRZ) eye diagrams without and with peaking, respectively. The NRZ eye diagram of FIG. 5B is substantially more open than the NRZ eye diagram of FIG. 5A, which signifies the impact of the peaking achieved by the pre-driver circuit 220 of the subject technology.

Figure 5C:
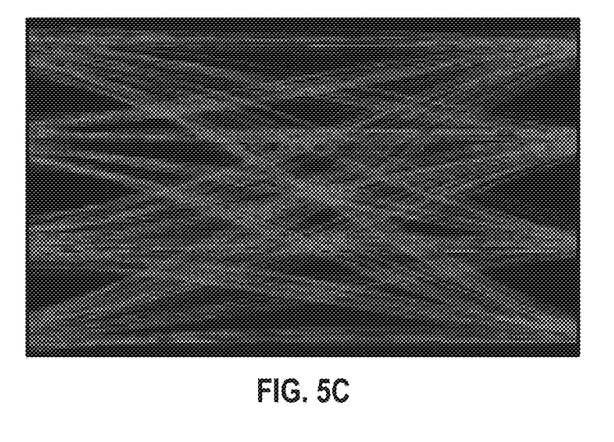
Figure 5D:
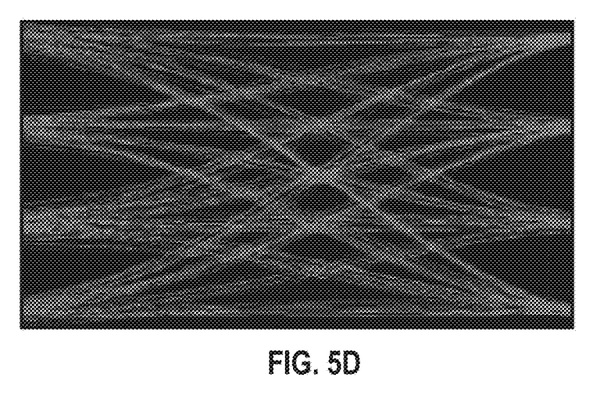

The simulations results shown in FIGS. 5C and 5D are pulse-amplitude modulation (PAM)4 transition diagrams without and with peaking, respectively. The PAM4 transition diagram of FIG. 5D is significantly more open than the PAM4 transition diagram of FIG. 5C, which indicates importance of the peaking achieved by the pre-driver circuit 220 of the subject technology.

Figure 5E:
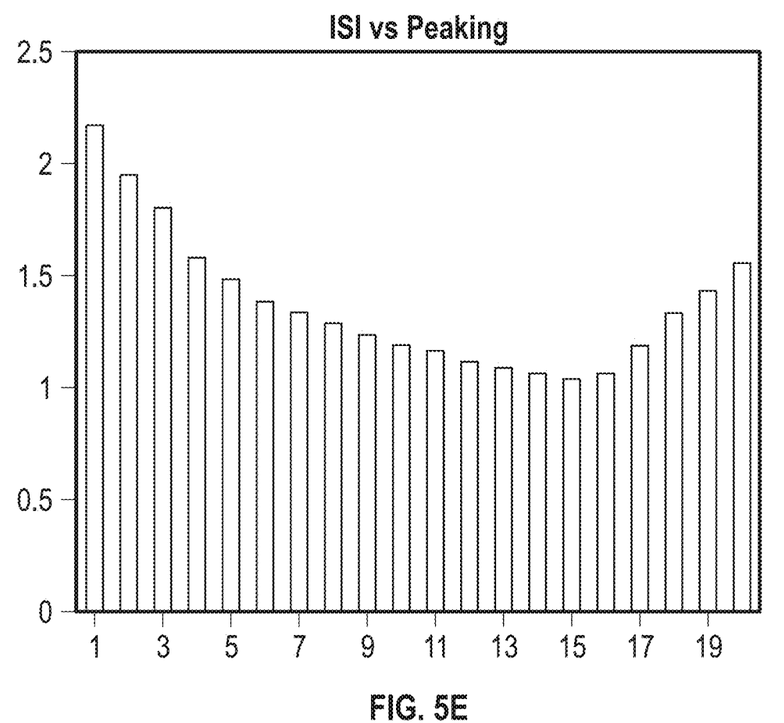

The bar chart shown in FIG. 5E depicts an example variation of ISI versus peaking values. The peaking values can be software and/or firmware programmable, as discussed above. The bar chart shown in FIG. 5E indicates that ISI value can first decrease with increasing the peaking value and can reach a lowest (optimum) value at a peaking value of about 15. Further increase in peaking causes the ISI value to rise, which is not desirable.

Figure 6:
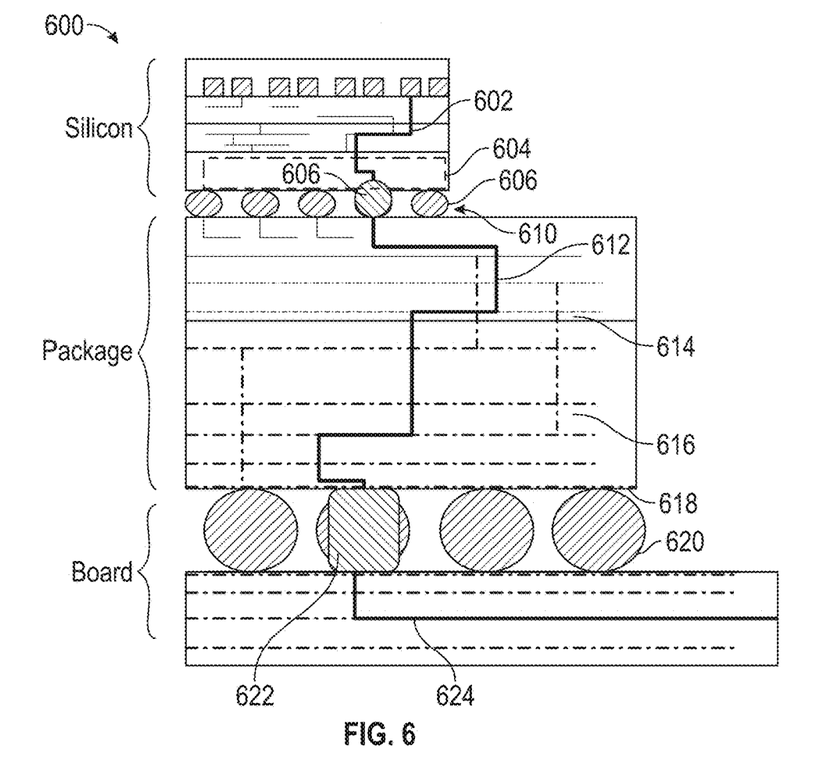
FIG. 6 is a schematic diagram illustrating a high-speed integrated circuit using aspects of the subject technology.

FIG. 6 is a diagram illustrating a high-speed integrated circuit 600 using aspects of the subject technology. The high-speed integrated circuit 600 includes three distinct layers, from top to bottom: a semiconductor (e.g., silicon) layer, a package layer and a board layer. The silicon layer may include a multilayer integrated circuit including a multiplexer (e.g., 110 of FIG. 1A), a pre-driver (e.g., 120 of FIG. 1A) and a driver (e.g., 130 of FIG. 1A) and other circuits such as ESD circuit. The multilayer integrated circuit of the silicon layer is coupled to the package layer and the board layer as described herein. It is understood that the package and board included in interface circuit 140 of FIG. 1A represents a circuit or system model of the package layer and the board layer coupled to the silicon layer. The silicon layer can be flip-chip coupled to the package layer via die bumps 606 (e.g., solder bumps). The silicon layer includes a substrate including conductor traces 604, which can connect the circuit layer of the die to the die bumps 606. The package layer includes, among other items, a flip-chip escape routing 612, package redistributions 614, package routing 616 and ball assignment on package 618. The package is coupled to the board via ball assignment on board 620. An interconnect from the silicon layer to the board layer includes a die interconnect 602 that is connected via one of the die bump 606 to the flip-chip escape routing 612 in the package layer and is finally connected to a board routing 624 via an on-board ball 622.

Figure 7:
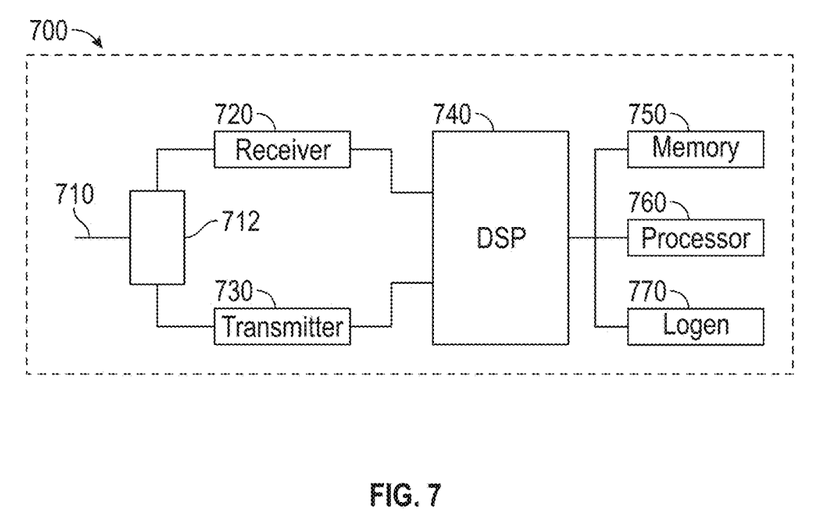
FIG. 7 is a block diagram illustrating a communication device, within which one or more aspects of the subject technology can be implemented.

FIG. 7 is a block diagram illustrating a communication device 700, within which one or more aspects of the subject technology can be implemented. In one or more implementations, the communication device 700 can be a wired or optical communication device having high-speed DACs that can use the pre-driver of the subject technology. The communication device 700 may comprise a channel 712, a receiver 720, a transmitter 730, a DSP(digital signal processing) 740, a memory 750, a processor 760 and a local oscillator generator (LOGEN) 770. In various embodiments of the subject technology, one or more of the blocks represented in FIG. 7 may be integrated on one or more semiconductor substrates. For example, the blocks 720-770 may be realized in a single chip or a single system on a chip, or may be realized in a multi-chip chipset.

The receiver 720 may comprise suitable logic circuitry and/or code that may be operable to receive and process signals from the channel 712. The receiver 720 may, for example, be operable to amplify and/or equalize received signals. In various embodiments of the subject technology, the receiver 720 may be operable to cancel noise in received signals and may be linear over a wide range of frequencies. In this manner, the receiver 720 may be suitable for receiving signals in accordance with a variety of wired and optical communication standards, such as IEEE 802.3B and OFI CEI-56G. In various embodiments of the subject technology, the receiver 720 may use few or no off-chip discrete components such as large capacitors and inductors. In one or more implementations, the receiver 720 may include high-speed DACs that can benefit from utilizing the pre-driver circuit of the subject technology to improve DAC performance and reduce power consumption.

The transmitter 730 may comprise suitable logic circuitry and/or code that may be operable to process and transmit signals to the channel 710. The transmitter 730 may, for example, be operable to send NRZ or PAM signals. In various embodiments of the subject technology, the transmitter 730 may be operable to send NRZ and PAM signals processed in accordance with a variety of wired or optical communication standards. In various embodiments of the subject technology, the transmitter 730 may be operable to provide signals for other devices such as laser drivers. In one or more implementations, the transmitter 730 may include high-speed DACs that can benefit from utilizing the pre-driver circuit of the subject technology to improve DAC driver performance and reduce power consumption.

The channel 712 may provide interconnects between transmitters and receivers of different building blocks within the system. The transmitters and receivers of different building blocks work together to ensure a functional system given this channel by using techniques such as pre-emphasis, clock-data recovery (CDR), continuous-time linear equalization (CTLE) and decision feedback equalization (DFE) and may be operable in multiple frequency bands of various wired or optical communication standards.

The DSP module 740 may comprise suitable logic, circuitry, interfaces, and/or code that may be operable to perform processing of the transmitted and received signals. The DSP module 740 may, for example, analyze received signals and generate control and/or feedback signals for configuring various components of the communication device 700, such as the receiver 720. The DSP module 740 may be operable to encode, decode, transcode, modulate, demodulate, encrypt, decrypt, scramble, descramble, and/or otherwise process data in accordance with one or more wired and optical communication standards.

The processor 760 may comprise suitable logic, circuitry, and/or code that may enable processing data and/or controlling operations of the communication device 700. In this regard, the processor 760 may be enabled to provide control signals to various other portions of the communication device 700. The processor 760 may also control transfer of data between various portions of the communication device 700. Additionally, the processor 760 may enable implementation of an operating system or otherwise execute code to manage operations of the communication device 700. In some implementations, the processor 760 may execute software components that can program peaking of the pre-driver circuit 220 of FIG. 2A.

The memory 750 may comprise suitable logic, circuitry, and/or code that may enable storage of various types of information such as received data, generated data, code, and/or configuration information. The memory 750 may comprise, for example, RAM, ROM, flash, and/or magnetic storage. In various embodiments of the subject technology, information stored in the memory 750 may be utilized for configuring the receiver 720 and/or the baseband processing module 740. In some implementations, the memory 750 may store image information from processed and/or unprocessed fingerprint images of the under-display fingerprint sensor of the subject technology. In some implementations, the memory 750 may store software components that can program peaking of the pre-driver circuit 220 of FIG. 2A.

The local-oscillator generator (LOGEN) 770 may comprise suitable logic, circuitry, interfaces, and/or code that may be operable to generate one or more oscillating signals of one or more frequencies. The LOGEN 770 may be operable to generate digital and/or analog signals. In this manner, the LOGEN 770 may be operable to generate one or more clock signals and/or sinusoidal signals. Characteristics of the oscillating signals such as the frequency and duty cycle may be determined based on one or more control signals from, for example, the processor 760 and/or the baseband processing module 740.

In operation, the processor 760 may configure the various components of the communication device 700 based on a wired or optical communication standard according to which it is desired to receive signals. Wired signals may be received from the channel 712, amplified, and equalized by the receiver 720. The baseband processing module 740 may perform noise estimation and/or noise cancellation, decoding, and/or demodulation of the received signals. In this manner, information in the received signal may be recovered and utilized appropriately. For example, the information may be audio and/or video to be presented to a user of the communication device, data to be stored to the memory 750, and/or information affecting and/or enabling operation of the communication device 700. The baseband processing module 740 may modulate, encode, and perform other processing on audio, video, and/or control signals to be transmitted by the transmitter 730 in accordance with various wired and optical communication standards.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

The predicate words "configured to," "operable to," and "programmed to" do not imply any particular tangible or intangible modification of a subject, but, rather, are intended to be used interchangeably. For example, a processor configured to monitor and control an operation or a component may also mean the processor being programmed to monitor and control the operation or the processor being operable to monitor and control the operation. Likewise, a processor configured to execute code can be construed as a processor programmed to execute code or operable to execute code.

A phrase such as an "aspect" does not imply that such aspect is essential to the subject technology or that such aspect applies to all configurations of the subject technology. A disclosure relating to an aspect may apply to all configurations, or one or more configurations. A phrase such as an aspect may refer to one or more aspects and vice versa. A phrase such as a "configuration" does not imply that such configuration is essential to the subject technology or that such configuration applies to all configurations of the subject technology. A disclosure relating to a configuration may apply to all configurations, or one or more configurations. A phrase such as a configuration may refer to one or more configurations and vice versa.

The word "example" is used herein to mean "serving as an example or illustration." Any aspect or design described herein as an "example" is not necessarily to be construed as preferred or advantageous over other aspects or designs.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for." Furthermore, to the extent that the term "include," "have," or the like is used in the description or the claims, such term is intended to be inclusive in a manner similar to the term "comprise" as "comprise" is interpreted when employed as a transitional word in a claim.

What is claimed is:

1. A pre-driver circuit comprising:
   a differential input circuit configured to receive a differential-input voltage;

a latch circuit configured to latch voltage levels of output-voltage signals at a differential output port of the pre-driver circuit; and a pair of capacitors coupling the differential input circuit to the latch circuit, wherein the pre-driver circuit is configured to enable peaking of the output-voltage signals for high-speed operation of the pre-driver circuit and a digital-to-analog converter (DAC)-driver circuit coupled to the pre-driver circuit, and wherein a swing of the output-voltage signals at low frequencies is determined by high and low bias-voltage levels of the latch circuit.

2. The pre-driver circuit of claim 1, wherein the differential input circuit comprises a pair of inverter circuits.

3. The pre-driver circuit of claim 1, wherein the high-speed operation comprise operation at data rates higher than about 100 Gbps.

4. The pre-driver circuit of claim 1, wherein at high frequencies each capacitor of the pair of capacitors is configured to form a voltage divider with an input capacitor of the DAC-driver circuit, wherein the high frequencies comprise frequencies above a high cut-off frequency of a frequency response of the pre-driver circuit.

5. The pre-driver circuit of claim 4, wherein at high frequencies, a voltage swing of the output-voltage signals is determined by capacitance values of capacitors of the voltage divider.

6. The pre-driver circuit of claim 1, wherein the latch circuit is configured to latch the voltage levels of output-voltage signals at low frequencies including near-zero frequencies.

7. The pre-driver circuit of claim 1, wherein the peaking of the output-voltage signals is achieved by enabling a swing of output-voltage signals at high frequencies to be larger than at low frequencies, wherein the high frequencies comprise frequencies above a high cut-off frequency of a frequency response of the pre-driver circuit, and the low frequencies include near zero frequencies.

8. The pre-driver circuit of claim 1, wherein the high and low bias-voltage levels of the latch circuit are programmable.

9. A method of pre-driver peaking for high-speed digital-to-analog converters (DACs), the method comprising:

receiving, by a differential input circuit of a pre-driver circuit, a differential-input voltage;

latching, by a latch circuit, voltage levels of output-voltage signals at a differential output port of the pre-driver circuit;

enabling, peaking of the output-voltage signals for high-speed operation of the pre-driver circuit and a digital-to-analog converter (DAC)-driver circuit coupled to the pre-driver circuit, wherein the differential input circuit is coupled to the latch circuit via a pair of capacitors; and dividing the differential-input voltage at high frequencies using capacitor-voltage dividers including the pair of capacitors.

10. The method of claim 9, wherein the differential input circuit comprises a pair of inverter circuits, and wherein the high-speed operation comprise operation at data rates higher than about 100 Gbps.

11. The method of claim 9, wherein the high frequencies comprise frequencies above a high cut-off frequency of a frequency response of the pre-driver circuit.

12. The method of claim 9, further comprising setting a swing of the output-voltage signals based on capacitance values of capacitors of the voltage divider.

13. The method of claim 12, wherein enabling peaking of the output-voltage signals is achieved by allowing a swing of the output-voltage signals at high frequencies to be larger than at low frequencies, wherein the high frequencies comprise the high frequencies comprise frequencies above a high cut-off frequency of a frequency response of the pre-driver circuit and the low frequencies include near zero frequencies.

14. The method of claim 13, further comprising setting a swing of output-voltage signals at low frequencies based on high and low bias-voltage levels of the latch circuit latching the voltage levels of the output-voltage signals at low frequencies including near zero frequencies.

15. The method of claim 14, further comprising programming, using a processor, the high and low bias-voltage levels of the latch circuit.

16. An apparatus comprising:

a multiplexer configured to receive parallel input data and provide a differential-input voltage; and a peaking pre-driver circuit coupled to a driver circuit of a high-speed digital-to-analog converter (DAC), the circuit comprising:

a differential input circuit configured to receive the differential-input voltage:

a latch circuit configured to latch voltage levels of output-voltage signals at a differential output port of the peaking pre-driver circuit; and a pair of capacitors coupling the differential input circuit to the latch circuit, wherein the peaking pre-driver circuit is configured to enable peaking of the output-voltage signals for high-speed operation of the peaking pre-driver circuit and a digital-to-analog converter (DAC)-driver circuit coupled to the peaking pre-driver circuit, and wherein the peaking of the output-voltage signals is achieved by enabling a swing of the output-voltage signals at high frequencies to be larger than at low frequencies.

17. The apparatus of claim 16, wherein the high-speed operation comprise operation at data rates higher than about 100 Gbps, and wherein at high frequencies each capacitor of the pair of capacitors is configured to form a voltage divider with an input capacitor of the DAC-driver circuit, wherein the high frequencies comprise frequencies above a high cut-off frequency of a frequency response of the peaking pre-driver circuit.

18. The apparatus of claim 16, the high frequencies comprise frequencies above a high cut-off frequency of a frequency response of the peaking pre-driver circuit, and the low frequencies include near zero frequencies.

19. The apparatus of claim 18, wherein at high frequencies, a swing of the output voltage signals is determined by capacitance values of capacitors of the voltage divider.

20. The apparatus of claim 18, wherein a swing of the output-voltage signals at low frequencies is determined by high and low bias-voltage levels of the latch circuit, and wherein the high and low bias-voltage levels of the latch circuit are programmable.

* * * * *

UNITED STATES PATENT AND TRADEMARK OFFICE
CERTIFICATE OF CORRECTION

PATENT NO. : 10,476,516 B1
APPLICATION NO. : 16/163446
DATED : November 12, 2019
INVENTOR(S) : Kun Chuai et al.

Page 1 of 1

It is certified that error appears in the above-identified patent and that said Letters Patent is hereby corrected as shown below:

In the Claims

Column 10, Line 52 (Claim 18): Insert --wherein-- after "16,"

Column 10, Line 57 (Claim 19): Replace "output voltage" with --output-voltage--.

Signed and Sealed this
Twenty-first Day of January, 2020

Andrei Iancu
*Director of the United States Patent and Trademark Office*